(12) United States Patent
Ignatiev et al.

(10) Patent No.: US 6,473,332 B1
(45) Date of Patent: Oct. 29, 2002

(54) ELECTRICALLY VARIABLE MULTI-STATE RESISTANCE COMPUTING

(75) Inventors: Alex Ignatiev, Houston; Naijuan Wu, Pearland; Shangqing Liu; E. Joseph Charlson, both of Houston, all of TX (US)

(73) Assignee: The University of Houston System, Houston, TX (US)

( * ) Notice: Subject to any disclaimer, the term of this patent is extended or adjusted under 35 U.S.C. 154(b) by 0 days.

(21) Appl. No.: 09/826,386

(22) Filed: Apr. 4, 2001

(51) Int. Cl.$^7$ .............................................. G11C 11/00
(52) U.S. Cl. .................................. 365/148; 365/185.03
(58) Field of Search .............................. 365/148, 185.03

(56) References Cited

U.S. PATENT DOCUMENTS

| | | | |
|---|---|---|---|
| 3,886,577 A | 5/1975 | Buckley | 357/2 |
| 5,097,443 A | 3/1992 | Kaneko et al. | 365/153 |
| 5,372,859 A | 12/1994 | Thakoor | 427/551 |
| 5,406,509 A | 4/1995 | Ovshinsky et al. | 365/113 |
| 5,418,389 A | 5/1995 | Watanabe | 257/295 |
| 5,541,809 A | 7/1996 | Kakizaki et al. | 361/683 |
| 5,792,569 A | 8/1998 | Sun et al. | 428/692 |
| 6,104,639 A | * 5/2000 | Hayashi et al. | 365/187 |
| 6,204,139 B1 | 3/2001 | Liu et al. | 438/385 |

FOREIGN PATENT DOCUMENTS

| | | | |
|---|---|---|---|
| JP | 0001972 | * 1/1990 | H01L/29/792 |

OTHER PUBLICATIONS

Betty Prince, "Semiconductor Memories", 1983, Wiley, 2$^{nd}$ edition, pp. 150–151.*

Hajto, J. et. al. Quatized Electron Transport in Amorphous–Silicon Memory Structures. Physical Review Letters; vol. 66, (14) Apr. 8, 1991, p. 1918–1921.

Dax, M. The Non–Volatile Memory Challenge.Semiconductor International, Sep. 1997, p. 84–92.

Xiong, G.C. Giant Magnetoresistive Memory Effect in Nd0.7Sr0.3Mnoz films. Appl. Phys. Lett.67(20) Nov. 13, 1995, p. 3031–3033.

(List continued on next page.)

Primary Examiner—Michael Tran
(74) Attorney, Agent, or Firm—Robert W. Strozier

(57) ABSTRACT

An electrically operated, overwritable, multivalued, non-volatile resistive memory element is disclosed. The memory element includes a two terminal non-volatile memory device in which a memory film material is included, and a circuit topological configuration is defined. The memory device relates generally to a unique new electrically induced variable resistance effect, which has been discovered in thin films of colossal magnetoresistive (CMR) oxide materials. The memory material is characterized by: 1) the electrical control of resistance through the application of short duration low voltage electrical pulses at room temperature and with no applied magnetic field; 2) increase of the resistance or decrease of the resistance depending on the polarity of the applied pulses; 3) a large dynamic range of electrical resistance values; and 4) the ability to be set at one of a plurality of resistance values within said dynamic range in response to selected electrical input signals so as to provide said single cell with multibit/multivalued storage capabilities. The memory element includes a circuit topology to construct a ROM/RAM configuration. The features of the memory element circuit are: 1) the ability to set and then measure the resistance of the two terminal multi-valued memory devices with negligible effects of sampling voltage and current; and 2) the ability to step up or down the resistance value, i. e., to set one of multiple number of resistance states, with repeated applications of pulses of varying amplitude.

43 Claims, 9 Drawing Sheets

OTHER PUBLICATIONS

Liu, S.Q. Electric–pulse–induced reversible resistance change effect in Magnetoresistive films. Applied Physics Letters vol. 76, No. 19, pp. 2749–2751, May 8, 2000.

Millis, A.J. Lattice effects in magnetoresistive manganese perovskites. Nature vol. 392, 1998,p. 147–150.

Seng Y.K. and S.S. Rofail, 1.5V High speed low powet CMOS current sense amplifier. Electronics Letters, $9^{th}$ Nov. 1995, vol. 31, No. 23, pp. 1991–1993.

De Teresa, J.M., et al., Evidence for magnetic polarons in the magnetoresistive perovskites, Nature vol. 386, Mar. 20, 1997.pp. 256–259.

Okano and Watanabe., Nonvolatile programmable two–terminal diodes using a ferroelectric semiconductor.Applied Physics Letters vol. 76,(2) Jan. 10, 2000, pp. 233–235.

* cited by examiner

ELECTRICALLY VARIABLE MULTI-STATE RESISTANCE COMPUTING

BACKGROUND OF THE INVENTION

1. Field of the Invention

The present invention relates to an electrically operated, overwritable, multivalued, non-volatile resistive memory element.

More particularly, the present invention relates to an electrically operated, overwritable, multivalued, non-volatile resistive memory element where the memory element includes a two terminal non-volatile memory device in which a memory film material is included, and a circuit topology configuration is defined and to methods for using the device and to methods for constructing dense solid state memory systems.

2. Description of the Related Art

Because of simple two terminal structure and stepwise nonvolatile resistance levels, resistive memories, which usually take the form of a resistive layer located between two metallic electrodes, have attracted past attention for nonvolatile, multi-valued logic.

Several semiconductor-related resistive memory devices have been previously developed. One example is a filament-type semiconductor device, as disclosed in U.S. Pat. No. 3,886,577 to William D. Buckley. After an electrical pulse with sufficient high voltage and sufficient long duration (50V at 1–100 ms) is applied to an amorphous semiconductor thin film, a portion of the film may be set to a low resistance crystalline state, i e., after the electric pulse, a low resistivity filament of generally under 5–10 microns in size, may form in the film. Afterwards, if a high current and shorter duration electrical pulse (e.g., a 150 mA pulse of 10 $\mu$s) is applied, the formed filament portion may be reset to a high resistance state. Because of the required long duration pulse for setting, and high current pulse for resetting, such devices have low working speeds and high power consumption. In addition, these kinds of memory devices are basically a bistable device—only a small number of discrete nonvolatile resistance steps can be obtained.

Another example of a semiconductor resistive memory device, as disclosed in U.S. Pat. No. 5,541,869 to Mervyn J. Rose et al. and in a published paper "Quantized Electron Transport in Amorphous-silicon Memory Structure," J. Hajto, A. E. Gage, and A. J. Snell, P. G. Lecomber and M. J. Rose, in Physical Review Letters, vol. 66, No. 14, PP.1918–1921, 1991, is the metal-amorphous silicon-metal (MSM) electrical memory switch. Such a device needs an initial "forming," which comprises applying high voltage, short duration pulses (e.g., 200 ns–1000 ns) to disperse small metallic particles or atoms of V, Co, Ni, Pd, Fe and Mn in the amorphous silicon as the active species. The forming process reduces the resistance of the device from a very high value (in practice~$10^9$ to $10^{11}$ $\Omega$) to a value within the range of $10^3$–$10^6$ $\Omega$. The resistance of the device can then be adjusted to a target value within this range. In addition to the troublesome initial forming step, this kind of device cannot store a large number of bits in one element. Furthermore, the adjustment of such a device's resistance to a target value depends on the application of pulses with specific voltage and duration so as to produce the desired resistance values, which for current applications requires additional complications of controlling pulse width and height.

Another kind of semiconductor resistive memory device, as disclosed in U.S. Pat. No. 5,406,509 to Stanford R. Ovshinsky; Qiuyi Ye; David A. Strand, and Wolodymyr Czubatj, is a resistive layer device, which uses chalcogenide memory material, instead of amorphous silicon. Chalcogenide-transition metal memory devices are also filament-type devices and exhibit switching characteristics (i.e., switching times, switching energies and resultant device resistance) similar to the electrical switching characteristics of Rose's MSM memory element described above, but can be directly overwritten.

In recent years, nonvolatile memory investigations have addressed ferroelectric and magnetoresistive materials, which are oxides and not semiconductors. In the oxide systems studied, the bit levels have generally been at 2 (high polarization-low polarization for ferroelectrics or high resistance-low resistance for magnetoresistive materials). Within these groups, the ferroelectric devices suffer from fatigue and retention problems. Moreover, reading a ferroelectric devices is information-destructive. See, e.g., "The Non-volatile Memory Challenge," M. Dax, *Semiconductor International*, Sep., 1997, PP. 84–92.

In the case of the magnetoresistive oxide devices, magnetic switching fields are generally high and temperatures of operation are very low. See, e.g., "Giant Magnetoresistive Memory Effect in $Nd_{0.7}Sr_{0.3}MnO_3$ Films," G. C. Xiong, Q. Li, H. L. Ju, S. M. Bhagat, S. E. lofland, R. L. Greene, and T. Venkatesan, *Appl. Phys. Lett.*, Vol. 67, PP. 3031–3033, 1995.

Thus, there is a need in the art for new resistive memory systems that are capable of storing data in a non-volatile and multi-valued manner using traditional read voltages and relatively low write voltage pulses of relatively short to very short duration and good fatigue resistance properties.

SUMMARY OF THE INVENTION

The present invention provides a resistive memory devices including a thin film of a colossal magnetoresistance (CMR) material and two electrically conductive contacts in electrical communication with a portion of the film for reading from and writing to the portion of the film. The term "in electrical communication with" means that a pathway exists, that allows electromagnetic fields to flow between the elements. These pathways can be any known contacting means for allowing electromagnetic fields to flow between elements such as wires, conductive elements in an integrated circuit, or any other type of electric or magnetic component that allows electromagnetic fields to travel between to elements.

The present invention also provides a memory element including a portion of a thin film of a CMR material and two electrically conductive contacts in electrical communication with the portion of the film.

The present invention also provides a memory element array including a plurality of memory elements of this invention formed on a substrate in a column-row or array format.

The present invention also provides a memory apparatus including a plurality of memory elements of this invention.

The present invention also provides a method for storing and retrieving data including the steps of pulsing a memory element of this invention with an electric pulse sufficient to transform the element from an initial resistive state to a final resistive state and detecting the final resistive state with a read pulse, which is insufficient to change the final state of the element.

The present invention also provides a method for storing and retrieving data including the steps of pulsing a memory element array of this invention with electric pulses sufficient to transform at least one element in the array from an initial resistive state to a final resistive state and detecting the final resistive state of all elements with read pulses, which are insufficient to change the final state of any element in the array.

The present invention also relates to a computer including a digital processing unit and a memory apparatus or array of this invention.

The present invention also relates to a method for storing and retrieving multi-state data including the steps of pulsing a memory element array of this invention with electric pulses sufficient to transform at least one element in the array from an initial resistive state to a final resistive state and detecting the final resistive state of all elements with read pulses, which are insufficient to change the final state of any element in the array and where the initial and final state are selected from a group of resistive states separated from each other by a resistance sufficient to allow each state to be independently and consistently identified.

The present invention also provides an electrical pulse operated, directly overwritable, multi-valued non-volatile resistive memory element where the memory cell is a two terminal device with a three layer thin film structure comprised of a bottom electrode, the resistive memory layer, and a top electrode all of which can be deposited on a variety of substrates including use of appropriate buffer-layer(s).

The present invention also provides an electrical pulse operated, directly overwritable, multi-valued non-volatile resistive memory element where the memory cell is a two terminal device with a two layer thin film structure comprised of a bottom resistive memory layer, and two top electrodes all of which can be deposited on a variety of substrates including use of appropriate buffer-layer(s).

The present invention also provides an electrical pulse operated, directly overwritable, multi-valued non-volatile resistive memory element where the memory cell is a two terminal device with a multiple layer thin film structure comprised of a multitude of resistive memory layers, and a multitude of electrodes all of which can be deposited on a variety of substrates including use of appropriate buffer-layer(s).

The present invention also provides a memory element including a thin film of a multi-valued, resistive memory material in electrical communication with a pair of electrodes having k resistive states, where the element is electrical pulse operable, directly overwritable, non-volatile resistive.

The present invention also provides a memory element including a thin film of a multi-valued, resistive memory material in electrical communication with a pair of electrodes having k resistive states, where the element is electrical pulse operable, directly overwritable, non-volatile resistive and the resistive state of the element is set by electric pulses at room temperature in the absence of an applied magnetic field.

The present invention also provides an electric pulse-induced resistance (EPIR)-based multi-valued resistive memory element with non-volatility, fast operation speed and low power consumption.

The present invention also provides an array circuit topology which using the memory elements of this invention to construct a ROM/RAM, EPROM, EPROM, or other similar memory configuration for data storage and retrieve or logic or other applications.

The present invention also provides a method for storing a base k number including the steps of supplying a resistive memory element including a thin filmed, multi-valued, resistive memory material having a plurality of resistive states, each resistive state having a different resistance in electrical communication with a pair of electrodes and applying an electric pulse to the electrodes, where the pulse is sufficient to change a resistance of the element from a first resistive state to a second resistive state, where the second resistive state corresponds to a value of a desired base k number. The method can also include the step of applying a reset electric pulse to the pair of electrodes, where the pulse is sufficient to change a resistive state of the element to an initial resistive state, corresponding to a numeric value of 0 or k.

The present invention also provides a method for retrieving a base k number including the steps of supplying a resistive memory element including a thin filmed, multi-valued, resistive memory material having a plurality of resistive states, each resistive state having a different resistance in electrical communication with a pair of electrodes, where the element is in a particular resistive state and applying an electric pulse to the pair of electrodes sufficient to determine the particular resistive state, without changing the resistive state of the element, where the particular resistive state corresponds to a particular base k number.

The present invention also provides a method for storing base k numbers including the steps of supplying an m×n array of resistive memory elements, each element comprising a thin filmed, multi-valued, resistive memory material having a plurality of resistive states, each resistive state having a different resistance in electrical communication with a pair of electrodes and applying an electric pulse to the electrodes of at least one element of the array, where the pulses are sufficient to change a resistive state of the at least one element from a current resistive state to a desired resistive state, where the desired resistive state corresponds to a base k number. The method can also include the steps of applying a reset electric pulse to the electrodes of each element, where the pulses are sufficient to change the current resistive state of each element to its initial resistive state, corresponding to a numeric value of 0 or k and applying an electric pulse to the electrodes of each element of the array, where the pulses are sufficient to change a resistance of each element from its initial resistive state to a desired resistive state, where the desired resistive state corresponds to a value of a desired base k number.

The present invention also provides a method for retrieving base k numbers including the steps of supplying an m×n array of resistive memory elements, each element comprising a thin filmed, multi-valued, resistive memory material having a plurality of resistive states, each resistive state has a different resistance in electrical communication with a pair of electrodes and applying an electric pulse to the electrodes of each element of the array, where the pulses are sufficient to determine a resistive state of each element in the array, without changing the resistive state of the elements, where the resistive state of each element corresponds to a particular base k number.

The present invention also provides a multi-valued resistive memory element including a thin film of a multi-valued, resistive memory material in electrical communication with a pair of electrodes having k resistive states, where a resistive state of the element is established by applying a write electric pulse to the electrodes sufficient to set the state to a resistance value corresponding to a value of a base k number and the resistive state of the element is determined by applying a read electric pulse to the electrodes sufficient to determine a resistance value of the element which corresponds to a value of a base k number, without changing the resistive state of the element.

DESCRIPTION OF THE DRAWINGS

The invention can be better understood with reference to the following detailed description together with the appended illustrative drawings in which like elements are numbered the same.

DETAILED DESCRIPTION OF THE INVENTION

Figure 1:
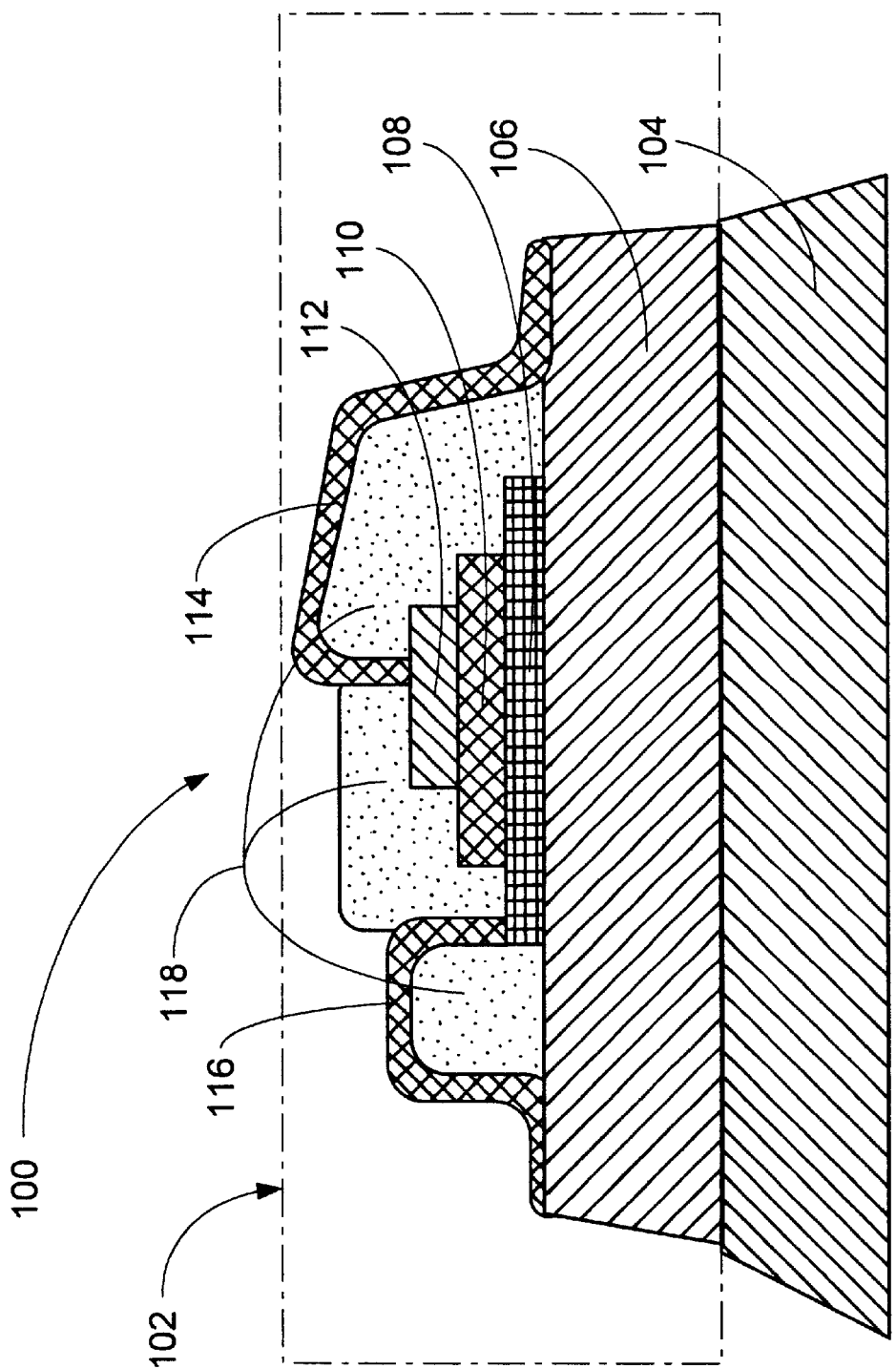
FIG. 1 depicts a schematic of a trilayered variable resistance cell or element 102, which can be used as a multi-valued resistance element and includes a substrate 104, a buffer layer 106, a bottom electrode 108, a resistive element 110, a top electrode 112, a top electrode connecting line 114, a bottom electrode connecting line 116 and an insulating filling material 118.

The inventors have found that a resistive memory element and apparatus incorporating the resistive element can be constructed having read/write/erase multi-state settings for storing information in base k, where k is an integer having a value between 2 and 64, preferably having a value between 2 and 56, between 2 and 48, between 2 and 40 or between 2 and 32, particularly having a value of 4, 8, 12, 16, 24, 32, 40, 48, 56 or 64, and especially having a value of 4, 8, 16, 32 or 64. so that the memory elements are directly compatible with base 2 computer logic and processing units. The elements of the present invention are writable and erasable at moderate voltages (normally 5V or less) using short electric pulses and are readable at normal integrated circuit voltages of generally 2V or less. The elements state can be set by a single pulse or by a series of pulses to a desired state or a series of pulses of varying amplitude and duration. State to state element transitions are completed by either additional negative or positive pulses or by resetting the state to zero and pulsing up to the desired state. Negative and positive pulsing being preferred.

In U.S. Pat. No. 6,204,139 to Shangqing Liu et al., the disclosure of which is incorporated herein by reference, the inventors described a new effect using CMR materials, the room-temperature electrical-pulse-induced resistance (EPIR) effect. The EPIR effect is manifested through the application of a pulsed electric potential across a thin film sample of a CMR material at room temperature and in the absence of an applied magnetic field. Further information about the EPIR effect can be obtained in Shangqing Liu et al, "Electrical-pulse-induced reversible resistance effect in magnetoresistive films," *Applied Physics Letters*, 76, 2749–2751 (2000), incorporated herein by reference.

The mechanism of the EPIR effect is though to be different from those of the filament-type semiconductor and doped amorphous silicon devices; therefore, the memory apparatuses based on the EPIR effect using CMR and CMR type materials do not required an initial forming or conditioning step and exhibits improved write, erase and read speeds. In addition, the EPIR-based memory elements of the present invention can support an extremely large number of nonvolatile levels or states (>50), thus providing for the construction of unique memory devices having multi-valued storage capabilities and methods for storing data to and retrieving data from such devices. The EPIR-based memory devices of this invention have significant advantages over the two main resistive memory type devices previously described.

The memory elements of this invention and apparatuses incorporating them, relate generally to a unique new electrically induced, variable resistance effect, which has been discovered in thin films of colossal magnetoresistive (CMR) oxide materials or similar types of materials as further described in "Electrical-pulse-induced reversible resistance effect in magnetoresistive films," Shangqing Liu, Naijuan Wu, and Alex Ignatiev, *Applied Physics Letters*, 76, 2749–2751 (2000). The memory materials useful in the memory element of this invention are characterized by: 1) an electrical control of resistance through the application of short duration low voltage electrical pulses at room temperature in the absence of an applied magnetic field; 2) an increase or decrease in the resistance of the material depending on the polarity of the applied electric pulses; 3) a large dynamic range of electrical resistance values; and 4) an ability to be set at one of a plurality of resistance values within the dynamic resistance range of the element in response to one or more selected electrical input pulses or signals so as to provide each element or cell with a multi-valued storage capabilities.

The electrical pulses used in adjusting the resistance of the memory element of this invention generally have durations in femtoseconds (fs) or nanoseconds (ns) and an amplitude between a start threshold value and a breakdown threshold value. Preferably, the pulses have durations between about 10 fs and about 1000 ns and particularly between about 100 fs and about 1000 ns and have amplitudes between about 0.1V and about 100V. The electric pulses used to read or detect the resistance have of the element are of a voltage and duration which does not adjust the resistance of the element being read.

The memory elements of this invention can be combined into a mass memory apparatus having a circuit topology consistent with RAM or ROM type memory devices or with programable ROM devices. The features of the memory element circuits of this invention are: 1) the ability to set an element to a given resistive state and measure the resistance state of the element in the memory circuit with negligible adverse effect of the element being read or adjacent element from the sampling voltage and associated current; and 2) the ability to step up or down the resistance value, i. e., the ability to transition between resistance states via repeated applications of pulses of the same or varying amplitude and/or duration to each element.

Suitable electrode materials include, without limitation, metals, metallic oxides, polymers, or mixtures or combinations thereof. Exemplary examples of are, but not limited to, Pt, Ag, Au, $LaSrCoO_3$, $YBa_2Cu_3O_{7-x}$, $RuO_2$, $IrO_2$, $SrRuO_3$, Al, Ta, TaSiN, MoN doped polyacetylene, polypyrrole, polyaniline, or any other "intrinsically conductive polymers" (ICP), or mixtures or combinations thereof.

Suitable resistive materials include, without limitation, CMR materials, other similar perovskite materials or mixture or combinations thereof. Exemplary examples of such materials are, but not limited to, $Pr_{1-x}Ca_xMnO_3$ (PCMO), $La_{1-x}Ca_xMnO_3$ (LCMO), $LaSrMnO_3$ (LSMO), $GdBa-Co_xO_y$ (GBCO) or other CMR oxides or mixtures or combinations thereof.

Suitable substrates that do not require buffer layers or other protective layer between the memory elements of this invention include, without limitation, $LaAlO_3$, $SrTiO_3$, $Al_2O_3$, MgO, or other substrates which are known for use as atomic templates for the atomically ordered growth of the resistive CMR layer or the bottom electrode layer, or mixtures or combinations thereof.

Suitable substrates that require buffer layers or other protective layer between them and the memory elements of this invention include, without limitation, Si, single-crystal silicon (Si), $SiO_2$, other semiconductor materials such as germanium (Ge), or compound semiconductors such as gallium arsenide (GaAs), InP, InSb, InAs, GaSb, or mixtures or combinations thereof.

Suitable buffer layers include, without limitation, any conductive or non-conductive material that does not noticeably impair the performance of the memory element of this invention, or mixtures or combinations thereof.

Suitable insulating filler materials include, without limitation, epoxy resins, filled epoxy resins, other non-conductive filler materials well-known in the art, or mixtures or combinations thereof.

Referring now to FIG. 1, one preferred embodiment of a memory apparatus 100 of this invention is shown to include a trilayered, multi-valued resistance element 102 deposited or formed on a substrate 104, which can include an optional buffer-layer or layers 106 interposed between the element 102 and the substrate 104. The element 102 includes a first electrode 108, a variable resistance material 110, and a second electrode 112. The apparatus 100 also includes a first electrode contact pad 114 and a second electrode contact pad 116, which allow the electrodes 108 and 112 to be brought into electrical communication with other devices. Optionally, the apparatus 100 can also include an insulating filling material 118 deposited or formed on the apparatus 100 to protect the components of the element 102. Moreover, the entire assembly can be further encased in an insulating material to form a memory chip or other similar device.

Figure 2:
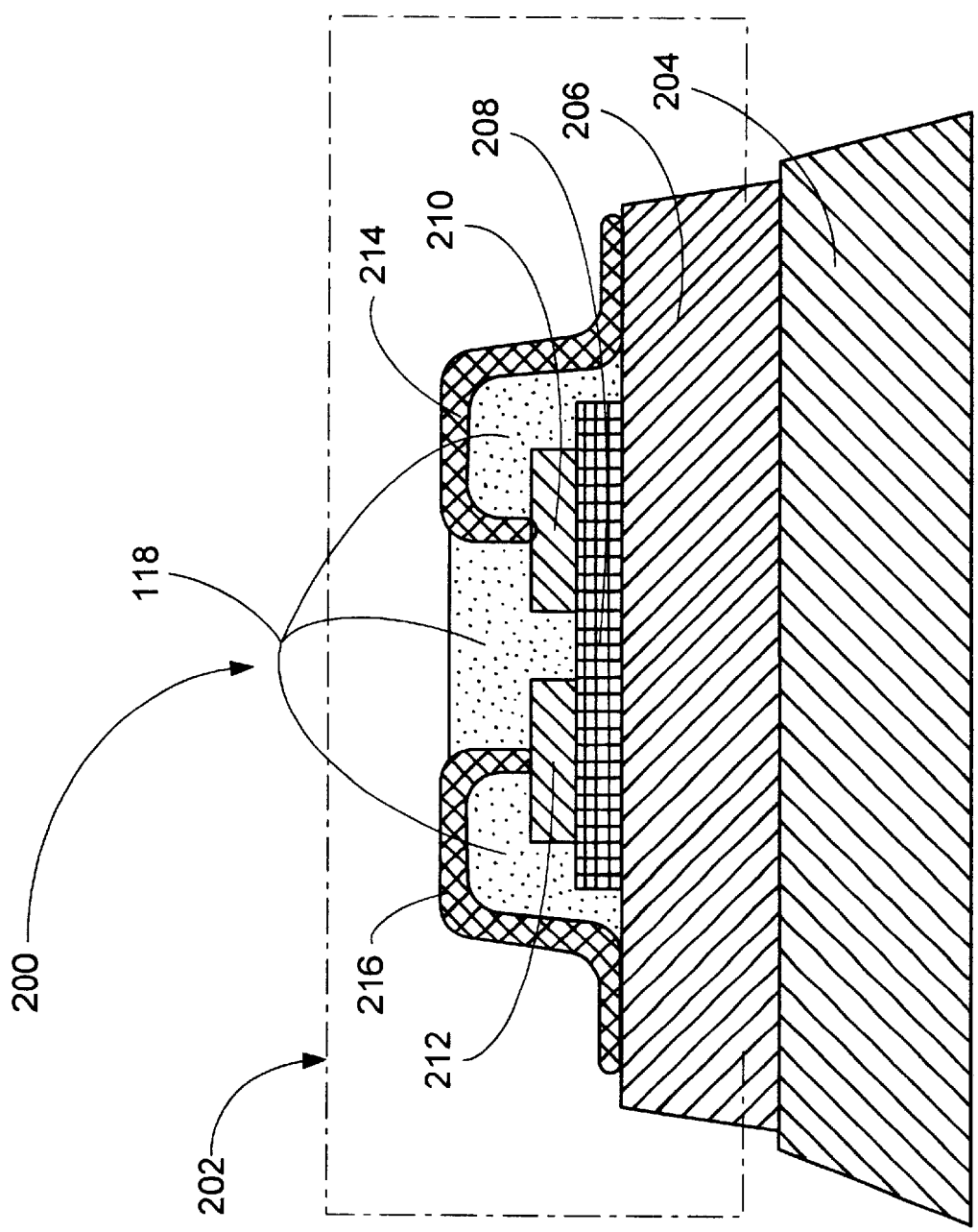
FIG. 2 depicts a schematic of a bilayer variable resistance cell 202, which can be used as multi-valued resistive memory element including substrate 204, buffer layer 206, resistive element 208, top electrodes 210 and 212, electrode contact pads 214 and 216 and an insulating filling material 218.

Referring now to FIG. 2, another preferred embodiment of a memory apparatus 200 of this invention is shown to include a bilayered, multi-valued resistance element 202 deposited or formed on a substrate 204, which can include an optional buffer-layer or layers 206 interposed between the element 202 and the substrate 204. The element 202 includes a variable resistance material 208, a first electrode 210, and a second electrode 212. The apparatus 200 also includes a first electrode contact pad 214 and a second electrode contact pad 216, which allow the electrodes 210 and 212 to be brought into electrical communication with other devices.. Optionally, the apparatus 200 can also include an insulating filling material 218 deposited or formed on the apparatus 200 to protect the components of the element 202. Moreover, the entire assembly can be further encased in an insulating material to form a memory chip or other similar device.

The resistance element material layer, electrodes and buffer layers (if needed) can be grown by pulsed laser deposition (PLD), sputtering, metal organic chemical vapor deposition (MOCVD), chemical vapor deposition (CVD), MOD, sol-gel deposition or other methods of oxide films formation known in the art. The variable resistance material (110 or 208), e.g., PCMO, LSMO, GBCO or other CMR oxide, is either deposited on an electrode 108 and supports the second electrode layer 112 in the trilayer design, or deposited directly on the substrate/buffer combination 204/206 and supports both top electrodes 210 and 212 in the bilayer design.

Properties of the multi-valued resistance element device are illustrated by measurement results from two illustrative examples of trilayer element structures: Ag/PCMO/Pt on $LaAlO_3$ substrate and Ag/PCMO/YBCO on $LaAlO_3$ substrate, but could be illustrated in a similar manner for bilayer structures and/or other multi-layer structures.

For the first type of trilayer sample, Ag/PCMO/Pt, write and erase electrical pulses are applied to the device through the bottom and top contact pads 114 and 118 which are connected to the top and the bottom electrodes 108 and 112, respectively. Applied pulses with amplitude and duration, the values of which are greater than a first set of values being defined as "the start threshold values," which result in change of device resistance. The amplitude and pulse width start threshold values are nominally 1V–3V and greater than 1ns respectively, and depend on the specific parameters of a device such as its resistive layer thickness, composition, and resistance. Pulses with negative polarity (negative pulse applied to the top electrode on the PCMO layer) resulted in a gradual and stepwise increase in resistance of the device to a high resistance saturation value. Pulses of opposite polarity (positive polarity) resulted in a gradual and stepwise decrease in resistance to a low resistance saturation value. The high resistance saturation and low resistance saturation values depend on the amplitude and duration of the applied pulses. The higher the amplitude, and/or the longer the pulse width, the higher the high resistance saturation value, and the lower the low resistance saturation value within the limit that the device does not break down.

Figure 3:
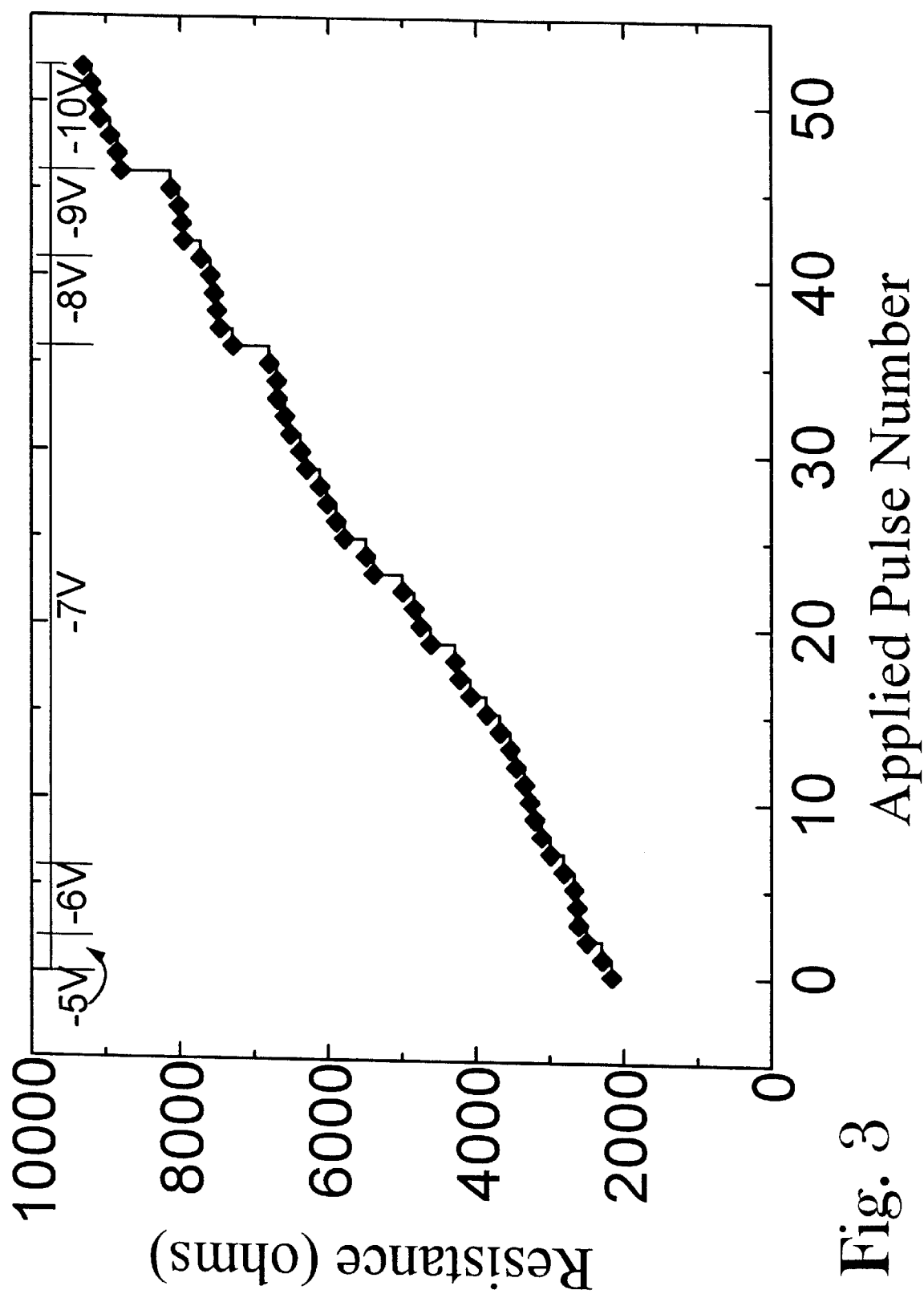
FIG. 3 depicts the nonvolatile stepwise discrete resistance changes versus pulse number and pulse amplitude for a Ag/Pr$_{1-x}$Ca$_x$MnO$_3$ (PCMO)/YBa$_2$Cu$_3$O$_{6+x}$ (YBCO) trilayer EPIR device at room temperature.

The pulse amplitude and duration must be less than, a second set of specific values defined as the breakdown threshold values", which also depend on the parameters of a specific device. A pulse with amplitude and duration of greater than the breakdown threshold values will damage the device. When the amplitude and duration of applied pulses are between the start threshold values and the breakdown threshold values, a resistance of an element within a memory device of this invention can be set to different discrete intermediate resistance levels between these two threshold values as shown in FIG. 3. In FIG. 3, a plot of the number of applied pulsed verses the resistance in ohms of the element is shown. The pulses are negative pulses of 100 ns duration, which increase the resistance of the elements, i.e., transitions up the available resistive states. The resistance of the element starts at about 2,000 ohms and steps up in a stair step like fashion to a final value of about 9,500 ohm, illustrating a simulated electrical-pulse-induced resistance change of a device under write pulses. It clearly for the results shown in FIG. 3, that more than 50 discrete non-volatile resistance levels can be obtained in a simple two terminal resistive memory cell or element of this invention. These levels can be measured with an accuracy ofbetter than about 1 part in 500, and the device can be written and erased many times. The changed resistance value, that is, a given resistance state, is stable with time with a resistance shift of less than 1% over about $2.5 \times 10^5$ seconds.

Figure 4:
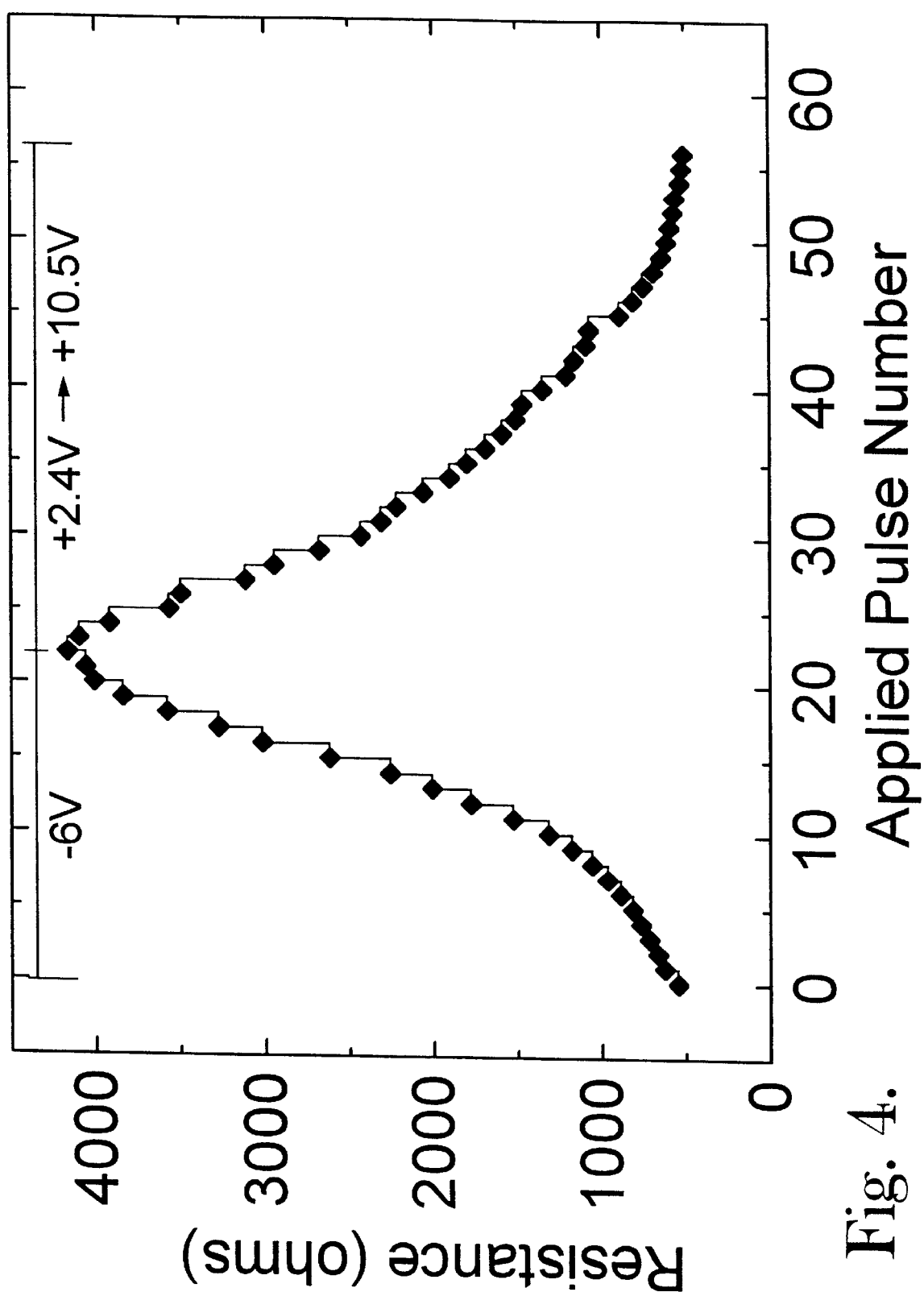
FIG. 4 depicts the nonvolatile stepwise discrete resistance step increase and decrease as a function of applied pulse number and pulse amplitude for a Ag/PCMO/YBCO trilayer EPIR device at room temperature.

The variable resistance memory element possesses multiple state capability, and is programmable, e.g., can be set to a target value by electrical pulses with different heights, widths and numbers as shown in FIG. 4. In FIG. 4, a plot of the number of applied pulsed verses the resistance in ohms of the element is shown for both negative pulses (up the resistive state ladder) and positive pulses (down the resistive state ladder). The resistive element starts at a resistive state having a resistance of about 900 ohms and is pulsed up to a resistive state having a resistance of about 4000 ohms and then is pulsed back down to its initial state of about 900 ohms illustrating the electrical-pulse-induced non-volatile resistance change of a device where both step-wise increase of resistance and step-wise decrease of resistance is demonstrated under the application of pulses of appropriate number, polarity and amplitude at a pulse width of 95 ns. FIG. 4 shows that more than 20 nonvolatile step-up and step-down resistance levels can be realized in a simple two terminal storage element. Based on these results, the elements of this invention are capable of attaining a larger number of resistance levels and devices utilizing these elements will be able to be constructed and optimized to take advantage of this large number of accessible states for the heterostructure with optimized pulsing and sampling processes and growth conditions.

The read/write/erase functions of the multi-valued resistance element of this invention are preliminarily satisfied at pulse widths of 1–100 ns. However, the possibility of even faster response time is expected for optimized heterostructures in the EPIR device.

The excitation/switching energy for a resistance element of 500 $\mu$m size with a write voltage of about 5V and a resistance of about 200 $\Omega$ may be less than ~2 nJ. This is already lower than certain CMOS-related devices (as noted by M. Dax in "the non-volatile memory challenge," Semiconductor International, Sep., 1997, PP.84–92), and will further decrease with decreased element size.

It is important to note that the EPIR device reported here does not depend on the storing of charge as in most semiconductor nonvolatile memories. Although not to be bound to any theory on the mechanism by which the resistive elements of this invention operate, the EPIR effect is though to depend on ferromagnetic cluster arrangements of polarons in the thin CMR films, which are accompanied by lattice distortions and phase separation. See, e.g., "Lattice Effects in Magneto Resistive Manganese Perovskites," A. J. Millis, Nature, 392, 147–150 (1998); and "Evidence for Magnetic Polarons in the Magnetoresistive Perovskites," J. M. De Teresa, M. R. Ibarra, P. A. Algarabel, C. Ritter, C. Marquina, J. Blasco, J. Garcia, A. del Moral and Z. Arnold, Nature, 386, 256–259 (1997). Such cooperative phenomena are not expected to be greatly affected by high-energy particles, and hence the EPIR memory devices should be radiation hard.

The present invention includes a circuit topology for such an electrically variable resistance device, and follows closely modern DRAM circuits (see, e.g., Y. K. Seng and S. S. Rofail, "1.5V high speed power CMOS current sense amplifier," Electronic Letters, 31, 1991–1992 (1995)), but allows for multiple states and non-volatile behavior.

The important features of the circuit topology for use with the memory elements of this invention are: 1) it can be devised to set and then measure the resistance of the resistive memory elements of this invention with negligible adverse effects on the resistive state of the memory element or of their long term stability due to the sampling voltage and current; and 2) it has the ability to step up or down between resistance state values with repeated applications of pulses of varying amplitudes, i.e. each elements can be set to any one of a number of resistance states (logic states for the circuit) independently. The constructed memory devices such as ROM or RAM devices and circuit topologies or configuration based on the memory elements of this invention allow determination of the resistive state of each element based on the number of read/write cycles applied to the elements in an overall electrically stable environment.

Figure 5:
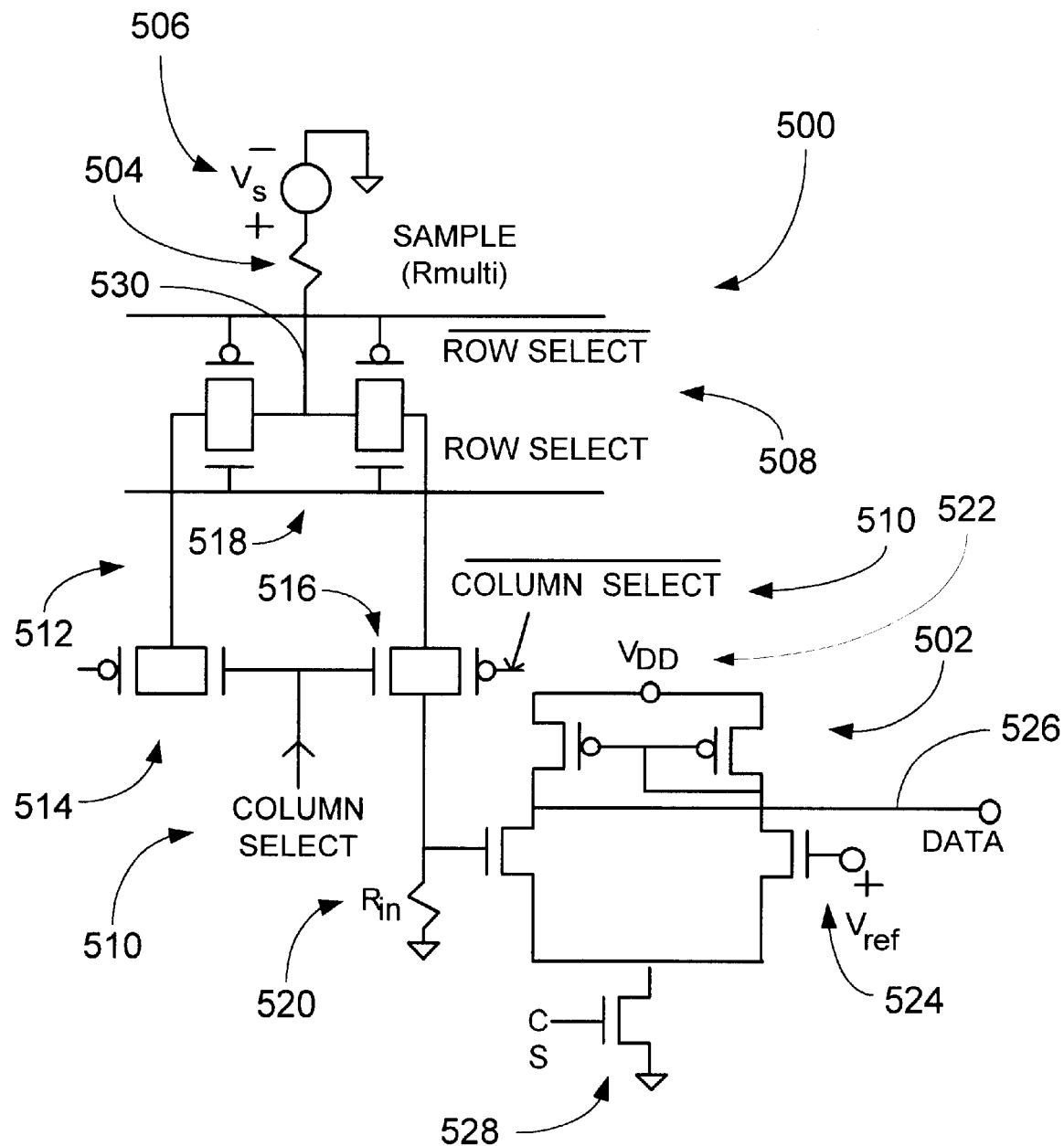
FIG. 5 depicts a schematic of a RAM circuit cell where SAMPLE (Rmulti) represents the EPIR resistance element in any number of given resistance states, e.g., high or low. A memory is assumed to be comprised of an array of similar cells.

Referring now to FIG. 5, an illustrative embodiment of an array-type mass-memory apparatus of this invention, generally 500 is shown to include a sense amplifier 502 used to read and/or write to a multi-state or variable resistance memory or storage element 504. The active element 504 can be any element of this invention including the specific elements illustrated in FIGS. 1 and 2. A source voltage $V_s$ 506 provides a read voltage to the element 504. The array also include standard row select circuitry 508 and column select circuitry 510. Write voltages are delivered along a left side 512 of a column 514. Transmission gates 516 and 518 perform standard addressing of an element 504 in a particular row and column, respectively of the array 500. A simplified sense amplifier 502 is shown in the lower right section of FIG. 5 to include a reference resistance $R_{in}$ 520 where a voltage across $R_{in}$ 520 is compared with a reference voltage $V_{ef}$ 522.

When a voltage difference $V_{DD}$ 524 is positive, the DATA line 526 goes low. $V_{ref}$ 522 is then pulsed to 10 volts to reset the DATA line 526. A chip select CS 528 enables the sense amplifier 502.

For writing to the memory element (setting the memory element to a given state), with the element 504 addressed by the column select 510 and row select 508, the write line 530 can be pulsed to set the resistance value of the memory element 504 to a particular state. $R_{in}$ 520 will also see this voltage; however, the DATA line 526 is in a don't care state.

Figure 6:
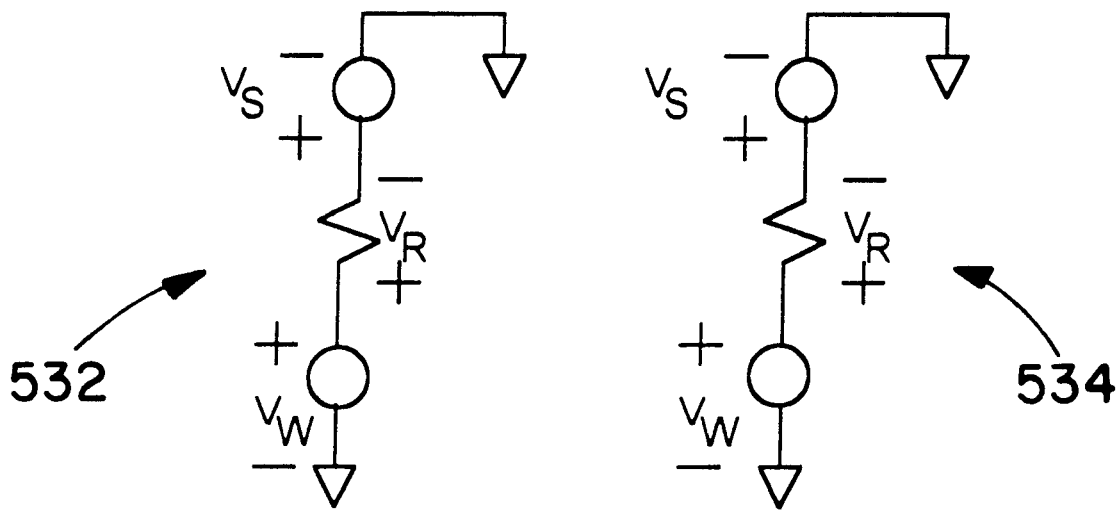
FIG. 6 depicts a write circuit models for the EPIR cell.
Figure 7:
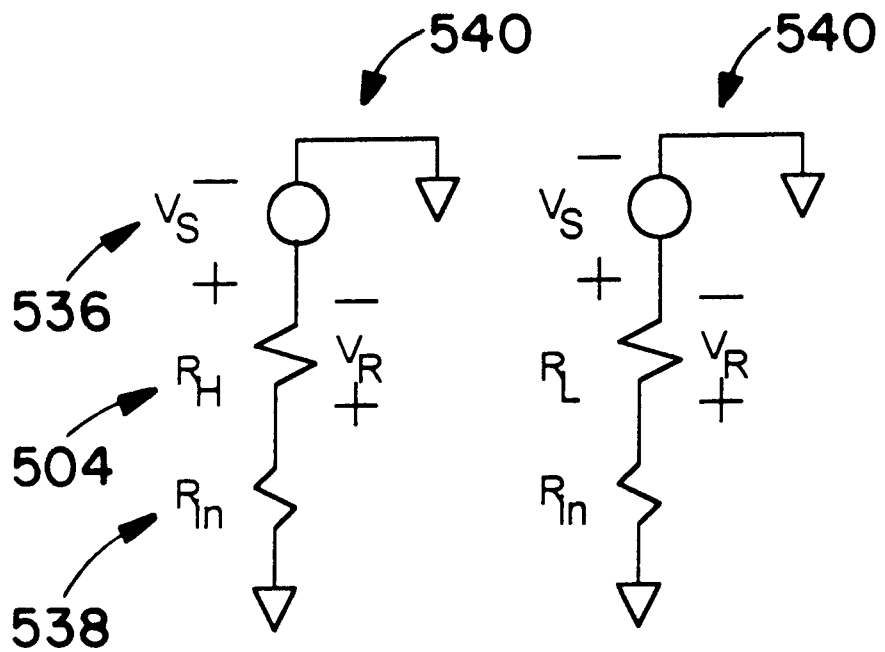
FIG. 7 depicts a read circuit model for the EPIR cell, with the assumption that the voltage drop across the transmission gate is negligible.

Referring now to FIG. 6, the element 504 of FIG. 5 is shown being written to with write voltages appropriate to cause a high resistance write 532 and a low resistance write 534. Referring now to FIG. 7, the element 504 of FIG. 5 is shown undergoing a read cycle. To sample a high resistance state, $R_H$, a source voltage $V_s$ 536 divides across the element 504 in the $R_H$ state and a reference resistance $R_{in}$ 538 in a series connection 540. Since the state $R_H$ is high, a maximum sample voltage will appear across the memory element 504. However, as shown in FIG. 7 because of the voltage division, this value will be at a maximum of about 316 mV, which should not affect the value of the memory element resistance. In the case of sampling low resistance, the portion of the sample voltage is smaller still because of the voltage division and is about a order of magnitude less or about 31.6 mV.

Figure 8:
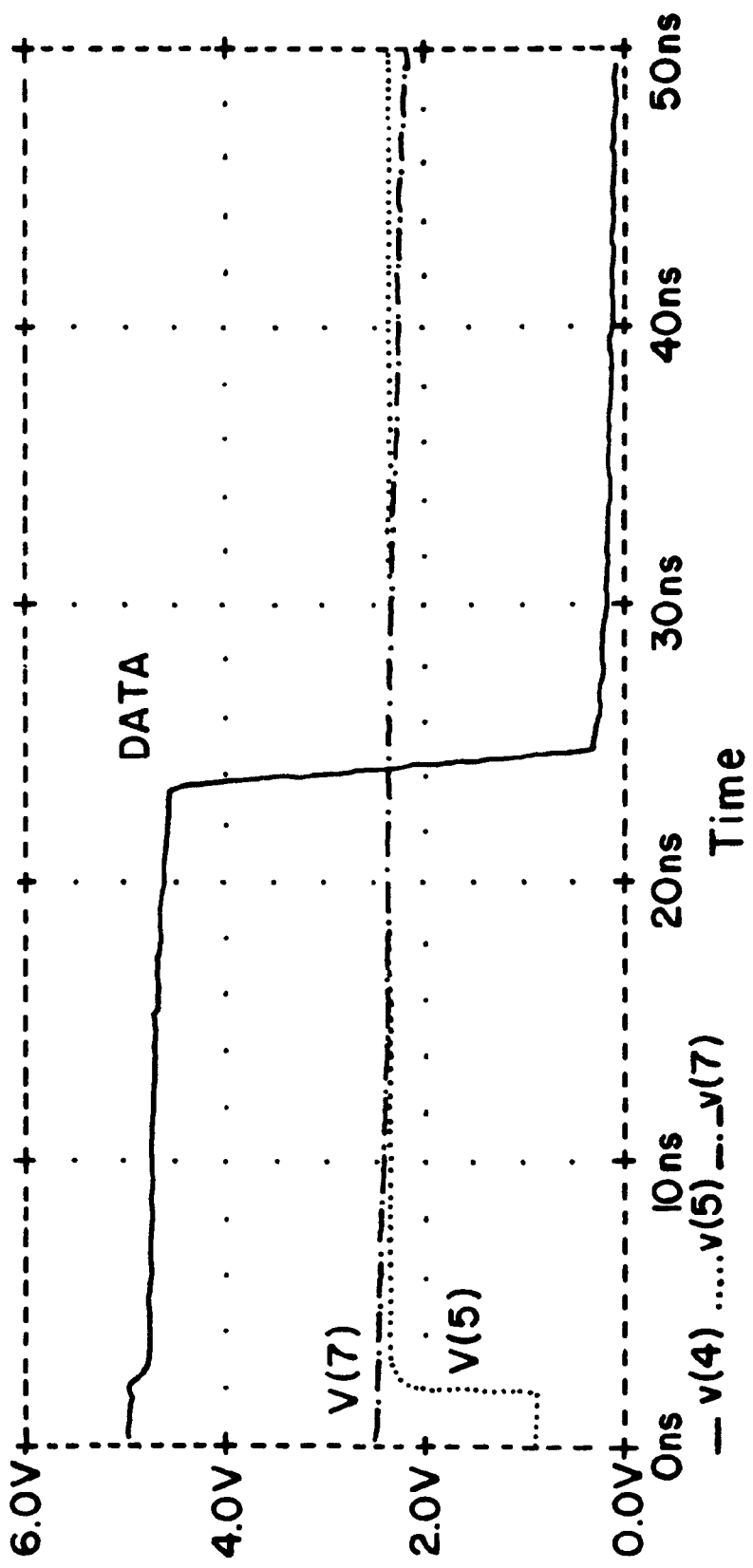
FIG. 8 depicts a plot of sense amplifier voltages during the read cycle of 5K ohms sample resistance. Shown is the linearly varying reference voltage v(7), the voltage across R$_{in}$, v(5) and the DATA line v(4). The crossover of v(7) and v(5) pulls the DATA line low.
Figure 9:
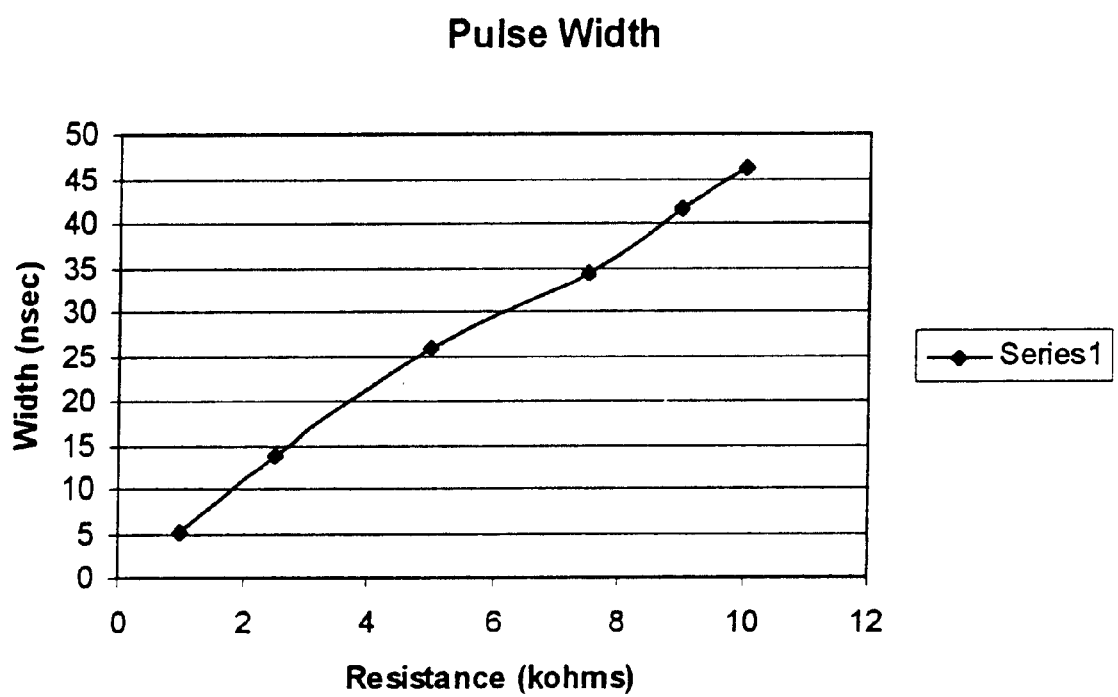
FIG. 9 depicts a DATA line pulse width versus memory element resistance.

The sense amplifier 502 of FIG. 5 operates as a differential amplifier. With the chip select 528 high, when the voltage across $R_{in}$ exceeds that of the reference voltage, the DATA line will go low. When $V_{ref}$ exceeds the voltage across $R_{in}$ 520, the DATA line 526 will go high. To sense multi-valued resistance states, a linearly varying reference voltage can be applied as shown in FIG. 8. When the reference voltage exceeds the input voltage across $R_{in}$ 520, the DATA line 526 will go low. Since the voltage across $R_{in}$ 520 is linearly dependent on the resistance of the memory element 504, the time width of the DATA pulse will be a direct measure of the sample resistance. A plot of pulse width versus resistance is shown in FIG. 9 from data simulated in the circuit analysis program PSpice. This varying pulse width can be routinely converted to a binary word representing the resistance of the memory element.

The circuit topology shown in FIGS. 5–7 is illustrative of a simplified memory array utilizing the resistive memory elements of this invention and is not included as a limitation on the design of memory devices which can be constructed using the resistive memory elements of this invention. In fact, many well-known circuit topologies can be used to directly integrated an EPIR resistance memory cell or element of this invention into today's RAM/ROM technology or programable RAM/ROM technology. There is expected to be little inertia to the acceptance of such an approach as it directly couples to current CMOS paradigms.

All references cited herein are incorporated herein by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

We claim:

1. A method for storing and retrieving a base k number comprising the steps of:
   supplying a resistive memory element comprising a thin filmed, multi-valued, resistive memory material in electrical communication with a pair of electrodes, where the element has a plurality of resistive states, each resistive state having a different resistance;
   applying an electric pulse to the pair of electrodes of the element, where the pulse is sufficient to change a resistance of the element from a first resistive state to a second resistive state, where the second resistive state corresponds to a value of a desired base k number; and
   applying an electric pulse to the pair of electrodes sufficient to determine the resistive state of the element, which corresponds to the desired base k number, without changing the resistive state of the element.

2. The method of claim 1, further comprising the step of:
   applying a reset electric pulse to the pair of electrodes, where the pulse is sufficient to change a resistive state of the element to an initial resistive state, corresponding to a numeric value of 0 or k.

3. The method of claim 1, wherein k is an integer having a value between 2 and 64.

4. The method of claim 1, wherein k is an integer having a value of 4, 8, 12, 16, 24, 32, 40, or 48.

5. The method of claim 1, wherein the pulses have durations in femtoseconds (fs) or nanoseconds (ns) and an amplitude between a start threshold value and a breakdown threshold value.

6. The method of claim 1, wherein the pulses have durations between about 10 fs and about 1000 ns and particularly between about 100 fs and about 1000 ns and have amplitudes between about 0.1V and about 100V.

7. The method of claim 1, wherein the material is selected from the group consisting of $Pr_{1-x}Ca_xMnO_3$ (PCMO), LaSrMnO$_3$ (LSMO), GdBaCo$_x$O$_y$ (GBCO), and mixtures and combinations thereof.

8. The method of claim 1, wherein the electrode comprise a conductive material selected from the group consisting of metals, conductive metal oxides, conductive polymers and mixtures and combinations thereof.

9. The method of claim 1, wherein the electrode comprise a conductive material selected from the group consisting of Pt, Ag, Au, LaSrCoO$_3$, YBa$_2$Cu$_3$O$_{7-x}$, RuO$_2$, IrO$_2$, SrRuO$_3$, Al, Ta, TaSiN, MoN doped polyacetylene, polypyrrole, polyaniline, and mixtures and combinations thereof.

10. A method for storing and retrieving base k numbers comprising the steps of:
    supplying an m×n array of resistive memory elements, each element comprising a thin filmed, multi-valued, resistive memory material in electrical communication with a pair of electrodes, where the element has a plurality of resistive states, each resistive state having a different resistance;
    applying an electric pulse to the electrodes of at least one element of the array, where the pulses are sufficient to change a resistive state of the at least one element from a current resistive state to a desired resistive state; and
    applying an electric pulse to the electrodes of each element in the array, sufficient to determine the desired resistive state of each element in the array, without changing the desired resistive state of each element in the array, where the desired resistive state of each element corresponds to a base k number.

11. The method of claim 10, further comprising the step of:
    applying a reset electric pulse to the electrodes of each element in the array, where the pulses are sufficient to change the current resistive state of each element to its initial resistive state, corresponding to a numeric value of 0 or k; and
    applying an electric pulse to the electrodes of each element of the array, where the pulses are sufficient to change a resistance of each element from its initial resistive state to the desired resistive state.

12. The method of claim 10, wherein k is an integer having a value between 2 and 64.

13. The method of claim 10, wherein k is an integer having a value of 4, 8, 12, 16, 24, 32, 40, or 48.

14. The method of claim 10, wherein the pulses have durations in femtoseconds (fs) or nanoseconds (ns) and an amplitude between a start threshold value and a breakdown threshold value.

15. The method of claim 10, wherein the pulses have durations between about 10 fs and about 1000 ns and particularly between about 100 fs and about 1000 ns and have amplitudes between about 0.1V and about 100V.

16. The method of claim 10, wherein the material is selected from the group consisting of $Pr_{1-x}Ca_xMnO_3$ (PCMO), LaSrMnO$_3$ (LSMO), GdBaCo$_x$O$_y$ (GBCO), and mixtures and combinations thereof.

17. The methods of claim 10, wherein the electrode comprise a conductive material selected from the group consisting of metals, conductive metal oxides, conductive polymers and mixtures and combinations thereof.

18. The method of claim 10, wherein the electrode comprise a conductive material selected from the group consisting of Pt, Ag, Au, LaSrCoO$_3$, YBa$_2$Cu$_3$O$_{7-x}$, RuO$_2$, IrO$_2$SrRuO$_3$, Al, Ta, TaSiN MoN doped polyacetylene, polypyrrole, polyaniline, and mixtures and combinations thereof.

19. A method of adjusting a resistance of a memory element comprising the steps of:

applying an electrical pulse to an electrical pulse operated, directly overwritable, multi-valued, non-volatile resistive memory element comprising a thin filed, multi-valued, resistive memory material in electrical communication with a pair of electrodes, where the pulse is sufficient to adjust a resistance of the element to a target resistance.

20. The method of claim 19, further comprising the step of:
applying an electrical pulse having a polarity to increase the resistance of the element.

21. The method of claim 19, further comprising the step of:
applying an electrical pulse having a polarity to decrease the resistance of the element.

22. The method of claim 19, further comprising the step of:
applying a plurality of electrical pulses having equal duration, amplitude and polarity to increase or decrease the resistance of the element in a stepwise manner, where resulting resistance of the element depends on the polarity and the number of pulses applied to the element.

23. The method of claim 19, further comprising the step of:
applying a plurality of electrical pulses to increase or decrease the resistance of the element to a target resistance, where the pulses have equal duration, amplitude and polarity and a magnitude of the increase or decrease in resistance depends on the number and polarity of the pulses applied to the element.

24. The method of claim 19, further comprising the step of:
applying a plurality of electrical pulses to increase or decrease the resistance of the element to a target resistance, where the pulses have equal amplitude and polarity and the same or different duration.

25. The method of claim 19, further comprising the step of:
applying an electrical pulse to increase or decrease the resistance of the element by a specific amount, where the pulse has a fixed amplitude and the duration and polarity of the applied pulse cause the resistance to increase or decrease by the specific amount.

26. The method of claim 19, further comprising the step of:
applying a plurality of electrical pulses to increase or decrease the resistance of the element in a target resistance, where the pulses have equal duration and polarity and the same or different amplitudes.

27. The method of claim 19, further comprising the step of:
applying an electrical pulse to increase or decrease the resistance of the element by a specific amount, where the pulse has fixed duration and the polarity and amplitude of the applied pulse cause the resistance to increase or decrease by the specific amount.

28. A k-bit resistive memory element comprising:
a thin film of a multi-valued, resistive memory material in electrical communication with a pair of electrodes having k resistive states, where a desired resistive state of the element is established by applying a write electric pulse to the electrodes sufficient to set the state to a resistance value corresponding to a value of a base k number and where the resistance value of the desired resistive state of the element is measured by applying a read electric pulse to the electrodes sufficient to determine the resistance value of the element corresponding to the value of the base k number, without changing the resistance value of the resistive state.

29. The element of claim 28, wherein k is an integer having a value between 2 and 64.

30. The element of claim 28, wherein k is an integer having a value of 4, 8, 12, 16, 24, 32, 40, or 48.

31. The element of claim 28, wherein the pulses have durations in femtoseconds (fs) or nanoseconds (ns) and an amplitude between a start threshold value and a breakdown threshold value.

32. The element of claim 28, wherein the pulses have durations between about 10 fs and about 1000 ns and particularly between about 100 fs and about 1000 ns and have amplitudes between about 0.1V and about 100V.

33. The element of claim 28, wherein the material is selected from the group consisting of $Pr_{1-x}Ca_xMnO_3$ (PCMO), $LaSrMnO_3$ (LSMO), $GdBaCo_xO_y$ (GBCO), and mixtures and combinations thereof.

34. The element of claim 28, wherein the electrode comprise a conductive material selected from the group consisting of metals, conductive metal oxides, conductive polymers and mixtures and combinations thereof.

35. The element of claim 28, wherein the electrode comprise a conductive material selected from the group consisting of Pt, Ag, Au, $LaSrCoO_3$, $YBa_2Cu_3O_{7-x}$, $RuO_2$, $IrO_2$, $SrRuO_3$, Al, Ta, TaSiN, MoN doped polyacetylene, polypyrrole, polyaniline, and mixtures and combinations thereof.

36. A multi-valued resistive memory array comprising:
an m×n array of resistive memory elements, where each element comprises a thin film of a multi-valued, resistive memory material in electrical communication with a pair of electrodes, and each element has k resistive states,
where a resistive state of each element having a resistance is established by applying a write electric pulse to its electrodes sufficient to set the resistance of resistive state to a value corresponding to a value of a base k number and where the resistance of the resistive state of each element is measured by applying a read electric pulse to its electrodes sufficient to determine the resistance of the resistive state of the element corresponding to the value of the base k number, without changing the resistance value of the resistive state.

37. The array of claim 36, wherein k is an integer having a value between 2 and 64.

38. The array of claim 36, wherein k is an integer having a value of 4, 8, 12, 16, 24, 32, 40, or 48.

39. The array of claim 36, wherein the pulses have durations in femtoseconds (fs) or nanoseconds (ns) and an amplitude between a start threshold value and a breakdown threshold value.

40. The array of claim 36, wherein the pulses have durations between about 10 fs and about 1000 ns and particularly between about 100 fs and about 1000 ns and have amplitudes between about 0.1V and about 100V.

41. The array of claim 36, wherein the material is selected from the group consisting of $Pr_{1-x}Ca_xMnO_3$ (PCMO), $LaSrMnO_3$ (LSMO), $GdBaCo_xO_y$ (GBCO), and mixtures and combinations thereof.

42. The array of claim 36, wherein the electrode comprise a conductive material selected from the group consisting of metals, conductive metal oxides, conductive polymers and mixtures and combinations thereof.

43. The array of claim 36, wherein the electrode comprise a conductive material selected from the group consisting of Pt, Ag, Au, $LaSrCoO_3$, $YBa_2Cu_3O_{7-x}$, $RuO_2$, $IrO_2$, $SrRuO_3$, Al, Ta, TaSiN, MoN doped polyacetylene, polypyrrole, polyaniline, and mixtures and combinations thereof.

* * * * *